United States Patent
Lu et al.

(10) Patent No.: US 11,421,315 B2
(45) Date of Patent: Aug. 23, 2022

(54) SPUTTERING TARGET AND METHOD OF PRODUCING SPUTTERING TARGET

(71) Applicant: ULVAC, INC., Chigasaki (JP)

(72) Inventors: Xiaoli Lu, Chigasaki (JP); Junichi Nitta, Chigasaki (JP); Akira Nakamura, Chigasaki (JP); Miho Satou, Chigasaki (JP)

(73) Assignee: Ulvac, Inc., Chigasaki (JP)

( * ) Notice: Subject to any disclaimer, the term of this patent is extended or adjusted under 35 U.S.C. 154(b) by 298 days.

(21) Appl. No.: 16/759,149

(22) PCT Filed: Mar. 28, 2019

(86) PCT No.: PCT/JP2019/013572
§ 371 (c)(1),
(2) Date: Apr. 24, 2020

(87) PCT Pub. No.: WO2020/021772
PCT Pub. Date: Jan. 30, 2020

(65) Prior Publication Data
US 2021/0172056 A1    Jun. 10, 2021

(30) Foreign Application Priority Data

Jul. 27, 2018  (JP) .............................. JP2018-140853

(51) Int. Cl.
*C23C 14/34* (2006.01)
*C22C 19/07* (2006.01)
*C22F 1/10* (2006.01)
*H01F 41/18* (2006.01)

(52) U.S. Cl.
CPC .......... *C23C 14/3414* (2013.01); *C22C 19/07* (2013.01); *C22F 1/10* (2013.01); *H01F 41/183* (2013.01)

(58) Field of Classification Search
CPC ........ C22F 1/10; C22C 19/07; C23C 14/3414
See application file for complete search history.

(56) References Cited

U.S. PATENT DOCUMENTS

| | | |
|---|---|---|
| 6,176,944 B1 | 1/2001 | Snowman et al. |
| 2001/0001438 A1 | 5/2001 | Cole et al. |
| 2002/0148724 A1 | 10/2002 | Cole et al. |
| 2010/0243435 A1 | 9/2010 | Kato |

FOREIGN PATENT DOCUMENTS

| | | |
|---|---|---|
| CN | 1635176 A | 7/2005 |
| CN | 101429646 A | 5/2009 |
| CN | 102634763 A | 8/2012 |
| CN | 103451586 A | 12/2013 |
| CN | 104694894 A | 6/2015 |
| JP | 2001-200356 A | 7/2001 |
| JP | 2001-514325 A | 9/2001 |
| JP | 2003-306751 A | 10/2003 |
| JP | 2007-297679 A | 11/2007 |
| JP | 5204460 B2 | 6/2013 |
| SG | 11201506950 W | 10/2015 |
| WO | WO-99/10548 A1 | 3/1999 |
| WO | WO-2014/157187 A1 | 10/2014 |

OTHER PUBLICATIONS

Office Action dated Mar. 2, 2021 in Korean Application No. 10-2020-7003711, along with its English translation.
Office Action dated Jun. 24, 2021 in Chinese Application No. 201980004037.2, along with its English translation.
International Search Report in International Application No. PCT/JP2019/013572, filed Mar. 28, 2019.

*Primary Examiner* — Jessee R Roe
(74) *Attorney, Agent, or Firm* — Saliwanchik, Lloyd & Eisenschenk (57) ABSTRACT

[Object] To provide a sputtering target with further improved sputtering efficiency, and a method of producing the sputtering target.
[Solving Means] In order to achieve the above-mentioned object, a sputtering target according to an embodiment of the present invention is a cobalt target having a sputtering surface and a purity of 99.95 wt % or more. An intensity ratio $(I_{(002)}+I_{(004)})/(I_{(100)}+I_{(002)}+I_{(101)}+I_{(102)}+I_{(110)}+I_{(103)}+I_{(112)}+I_{(004)})$ of X-ray diffraction peaks corresponding to a (100) plane, a (002) plane, a (101) plane, a (102) plane, a (110) plane, a (103) plane, a (112) plane, and a (004) plane of a hexagonal close-packed lattice structure along the sputtering surface is 0.85 or more.

4 Claims, 5 Drawing Sheets

SPUTTERING TARGET AND METHOD OF PRODUCING SPUTTERING TARGET

CROSS-REFERENCE TO RELATED APPLICATIONS

This application is the U.S. national stage application of International Patent Application No. PCT/JP2019/013572, filed Mar. 28, 2019, which claims the benefit under 35 U.S.C. § 119 of Japanese Application No. 2018-140853, filed Jul. 27, 2018, the disclosures of each of which are incorporated herein by reference in their entirety.

TECHNICAL FIELD

The present invention relates to a sputtering target and a method of producing the sputtering target.

BACKGROUND ART

There is a sputtering method as examples of a method of depositing a thin-film material used for a device such as a semiconductor device. Among them, a magnetron sputtering method with an improved deposition rate is often used.

However, in the case where a ferromagnetic material such as cobalt is applied to a sputtering target (hereinafter, target) in a magnetron sputtering method, the following problem occurs. For example, in the case where the magnetic field leaking from a magnet disposed on the back surface of the target to the front surface of the target is weak, the magnetic flux density on the front surface of the target decrease, and the sputtering efficiency is significantly reduced.

Meanwhile, there is a technology for improving the sputtering efficiency of a cobalt target by reducing the magnetic permeability in the direction parallel to the sputtering surface and increasing the magnetic permeability in the direction perpendicular to the sputtering surface (see, for example, Patent Literature 1).

CITATION LIST

Patent Literature

Patent Literature 1: Japanese Patent Application Laid-open No. 2007-297679

DISCLOSURE OF INVENTION

Technical Problem

As described above, there is a technology for improving the sputtering efficiency of a cobalt target by reducing the magnetic permeability in the direction parallel to the sputtering surface and increasing the magnetic permeability in the direction perpendicular to the sputtering surface. However, further improvements are required for the target as the accuracy of the device increases.

In view of the circumstances as described above, an object of the present invention is to provide a sputtering target with further improved sputtering efficiency, and a method of producing the sputtering target.

Solution to Problem

In order to achieve the above-mentioned object, a sputtering target according to an embodiment of the present invention is a cobalt target having a sputtering surface and a purity of 99.95 wt % or more. And an intensity ratio $(I_{(002)}+I_{(004)})/(I_{(100)}+I_{(002)}+I_{(101)}+I_{(102)}+I_{(110)}+I_{(103)}+I_{(112)}+I_{(004)})$ of X-ray diffraction peaks corresponding to a (100) plane, a (002) plane, a (101) plane, a (102) plane, a (110) plane, a (103) plane, a (112) plane, and a (004) plane of a hexagonal close-packed lattice structure along the sputtering surface is 0.85 or more.

According to such a sputtering target, since the amount of a magnetization easy axis C oriented perpendicular to the sputtering surface of the cobalt target is remarkably high, the effect of trapping plasma in the vicinity of the sputtering surface is enhanced, and the sputtering efficiency is significantly improved. Further, since the orientations of the magnetization easy axes C are uniformly aligned on the sputtering surface, a film having a uniform film thickness distribution and a film having a uniform sheet resistance are formed on a substrate by using the target.

In the sputtering target, a relative magnetic permeability along the sputtering surface may be less than 5.

According to such a sputtering target, since the relative magnetic permeability along the sputtering surface is 5 or less, the magnetic flux density leaking perpendicular to the sputtering surface significantly increases. As a result, the effect of trapping plasma in the vicinity of the sputtering surface is enhanced and the sputtering efficiency is significantly improved. Further, a film having a uniform film thickness distribution and a film having a uniform sheet resistance are formed on a substrate by using the target.

In the sputtering target, a half value width of the X-ray diffraction peak of the (002) plane of the hexagonal close-packed lattice structure along the sputtering surface may be 0.3° or less.

According to such a sputtering target, since the half value width of the X-ray diffraction peak corresponding to the (002) plane of the hexagonal close-packed lattice structure along the sputtering surface is 0.3° or less, the orientations of the magnetization easy axes C are uniform on the sputtering surface. As a result, the effect of trapping plasma in the vicinity of the sputtering surface is enhanced, and the sputtering efficiency is significantly improved. Further, a film having a uniform film thickness distribution and a film having a uniform sheet resistance are formed on a substrate by using the target.

In order to achieve the above-mentioned object, in a method of producing a sputtering target according to an embodiment of the present invention, a cobalt plate is formed by performing hot forging and hot rolling on a cobalt ingot; first vacuum heating is performed on the cobalt plate at a temperature higher than a transition temperature, a transition from a hexagonal close-packed lattice structure to a face-centered cubic structure takes place at the transition temperature; vacuum cooling is performed on the cobalt plate so that a temperature of the cobalt plate is lower than the transition temperature; cold rolling is performed on the cobalt plate so that a rolling reduction is 17% or more and 35% or less; and second vacuum heating is performed on the cobalt plate at a temperature lower than the transition temperature.

According to such a method of producing a sputtering target, since the amount of a magnetization easy axis C oriented perpendicular to the sputtering surface of the cobalt target significantly increases, the effect of trapping plasma in the vicinity of the sputtering surface is enhanced, and the sputtering efficiency is significantly improved. Further, since the orientations of the magnetization easy axes C are uniform on the sputtering surface, a film having a uniform film thickness distribution and a film having a uniform sheet resistance are formed on a substrate by using the target.

Advantageous Effects of Invention

As described above, according to the present invention, it is possible to provide a sputtering target with further improved sputtering efficiency, and a method of producing the sputtering target.

MODE(S) FOR CARRYING OUT THE INVENTION

Hereinafter, an embodiment of the present invention will be described with reference to the drawings. In each drawing, XYZ axis coordinates are introduced in some cases. Further, the same members or members having the same function are denoted by the same reference symbols, and after the member is described, description of thereof is omitted as appropriate in some cases. Further, the rolling reduction exemplified in this embodiment is defined by $((t_0-t_1)/t_0) \times 100(\%)$ in the case where an initial thickness $t_0$ turns into a thickness t1 by rolling.

Figure 1A:
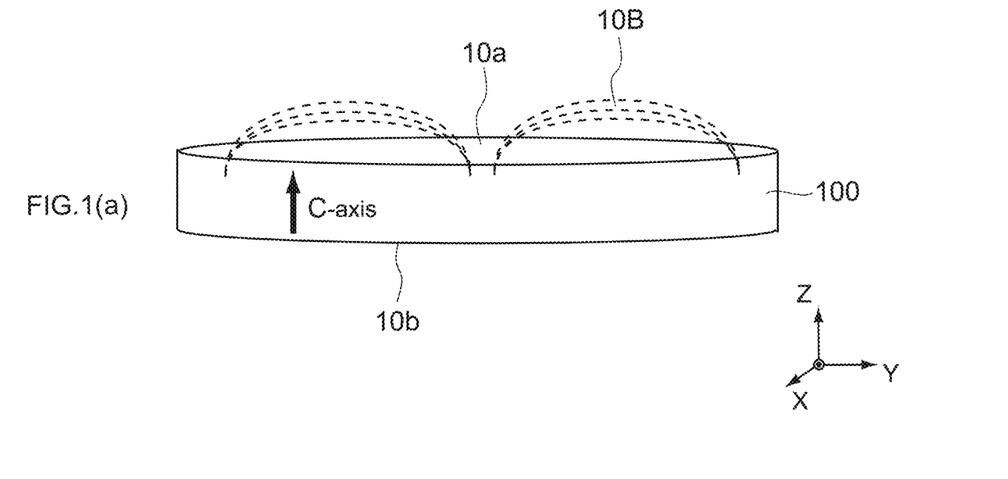
FIG. 1(a) is a schematic perspective view of a target according to this embodiment.
Figure 1B:
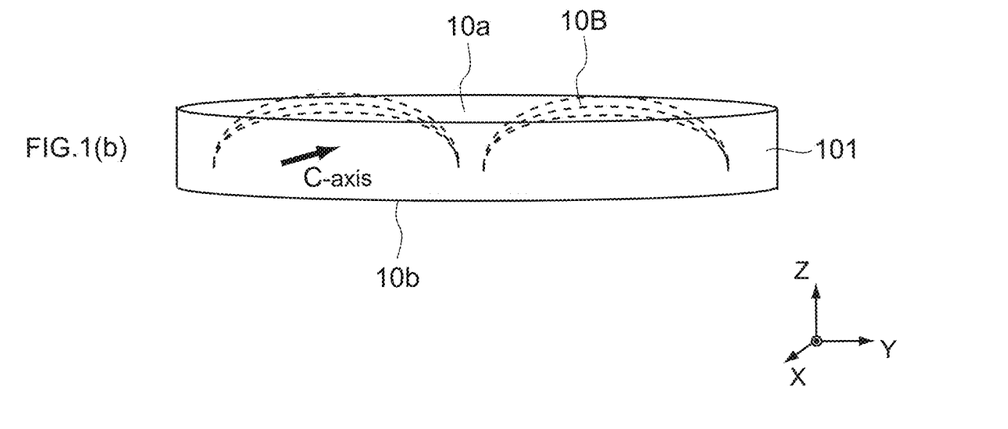
FIG. 1(b) is a schematic perspective view of a target according to a Reference Example.

FIG. 1(a) is a schematic perspective view of a target according to this embodiment. FIG. 1(b) is a schematic perspective view of a target according to a Reference Example.

In a target 100 according to this embodiment shown in FIG. 1(a), the purity of cobalt is 99.95 wt % or more. For example, the target 100 is a sputtering target having the purity of cobalt of 5N (99.999) wt % or more. In FIG. 1(a), the disk-shaped target 100 is shown as an example. The X-Y axis plane corresponds to a plane in parallel with a sputtering surface 10a and a back surface 10b of the target 100. The Z axis corresponds to the thickness direction of the target 100.

The target 100 has the sputtering surface 10a and the back surface 10b opposite to the sputtering surface 10a. The sputtering surface 10a is a surface to be exposed to plasma (sputtering gas) during sputtering deposition. The back surface 10b is a surface facing a magnet (not shown). That is, a magnet is disposed on the side of the back surface 10b and the target 100 is used as a target for magnetron sputtering. Further, as necessary, a backing plate is disposed on the side of the back surface 10b in some cases.

In the case where the target 100 is disk-shaped, the external shape of the target 100 has a size of 100 mm or more and 500 mm or less, for example, 400 mm. The target 100 does not necessarily need to be disk-shaped, and may be a rectangular plate. In this case, the horizontal length is 250 mm or more and 500 mm or less, and the vertical length is 100 mm or more and 150 mm or less. Further, the thickness of the target 100 is 2 mm or more and 6 mm or less, for example, is 3 mm.

In the target 100 shown in of FIG. 1(a), the target 100 has a hexagonal close-packed lattice structure (hcp) of cobalt, and the magnetization easy axis C thereof is preferentially oriented perpendicular to the sputtering surface 10a of the target 100. With such a configuration, a magnetic flux B leaking from a magnet disposed on the side of the back surface 10b of the target 100 to the sputtering surface 10a via the inside of the target 100 increases, and the magnetic flux density in the vicinity of the sputtering surface 10a increases.

As a result, the effect of trapping plasma in the vicinity of the sputtering surface 10a is enhanced, and the sputtering efficiency is significantly improved.

Further, since orientations of the magnetization easy axes C perpendicular to the sputtering surface 10a are aligned at the central part and the periphery of the target 100, the target 100 has uniform magnetic properties. As a result, a film having a uniform film thickness distribution and a film having a uniform sheet resistance are formed on the substrate by performing deposition on a substrate using the target 100.

Meanwhile, as in a target 101 shown in FIG. 1(b), in the case where the magnetization easy axis C of the hexagonal close-packed lattice structure of cobalt is inclined with respect to the sputtering surface 10a or oriented in parallel with the sputtering surface 10a, or where a crystal having a face-centered cubic structure (fcc) of cobalt remains in the target 101, the magnetic flux from the magnet easily enters within the target 101 and the magnetic flux density in the vicinity of the sputtering surface 10a decreases. Alternatively, variation in the magnetic flux density in the vicinity of the sputtering surface 10a becomes large.

As a result, in the case of using the target 101, the effect of trapping plasma is reduced, and the sputtering efficiency is significantly reduced. Further, even in the case of performing deposition using the target 101, a film having a uniform film thickness distribution and a film having a uniform sheet resistance are not likely to be formed on the substrate.

In contrast, in the target 100 according to this embodiment, the (002) plane and the (004) plane of the hexagonal close-packed lattice structure are oriented along the sputtering surface 10a over the entire area of the sputtering surface 10a in the case where the cobalt crystal plane is represented by a three-index notation. Here, the hcp (002) plane and the hcp (004) plane are planes perpendicular to the magnetization easy axis C.

For example, in the target 100, the intensity ratio $(I_{(002)}+I_{(004)})/(I_{(100)}+I_{(002)}+I_{(101)}+I_{(102)}+I_{(110)}+I_{(103)}+I_{(112)}+I_{(004)})$ of X-ray diffraction peaks corresponding to a (100) plane, a (002) plane, a (101) plane, a (102) plane, a (110) plane, a (103) plane, a (112) plane, and a (004) plane of the hexagonal close-packed lattice structure along the sputtering surface 10a is 0.85 or more as an average value of measurement at a plurality of points on the sputtering surface 10a. This intensity ratio is favorably 0.9 or more and more favorably 0.95 or more. In the case where the above-mentioned intensity ratio is less than 0.85, there is a possibility that a sufficiently uniform film thickness distribution and a uniform sheet resistance cannot achieved, then, it is not favorable.

Further, a relative magnetic permeability μ along the sputtering surface 10a is less than 5 as an average value of measurement at a plurality of points on the sputtering surface 10a in the target 100. In the case where the above-mentioned relative magnetic permeability μ is 5 or more, there is a possibility that a sufficiently uniform film thickness distribution and a uniform sheet resistance cannot achieved, then, it is not favorable.

Further, the half value width of the X-ray diffraction peak corresponding to the (002) plane of the hexagonal close-packed lattice structure along the sputtering surface 10a is 0.3° or less as an average value of measurement at a plurality of points on the sputtering surface 10a in the target 100. In the case where the above-mentioned half value width is more than 0.3°, there is a possibility that a sufficiently uniform film thickness distribution and a uniform sheet resistance cannot achieved, then, it is not favorable.

With the target 100 having the above-mentioned magnetic properties, the magnetic permeability in the X-Y axis direction of the target 100 can be reduced, and the magnetic flux density leaking from the magnet to the sputtering surface 10a increases. Further, the irregularity of the magnetic flux density in the vicinity of the sputtering surface 10a is reduced. As a result, a film having a uniform film thickness distribution and a film having a uniform sheet resistance are formed on the substrate by performing deposition on a substrate using the target 100.

Next, a process of producing the target 100 will be described.

Figure 2:
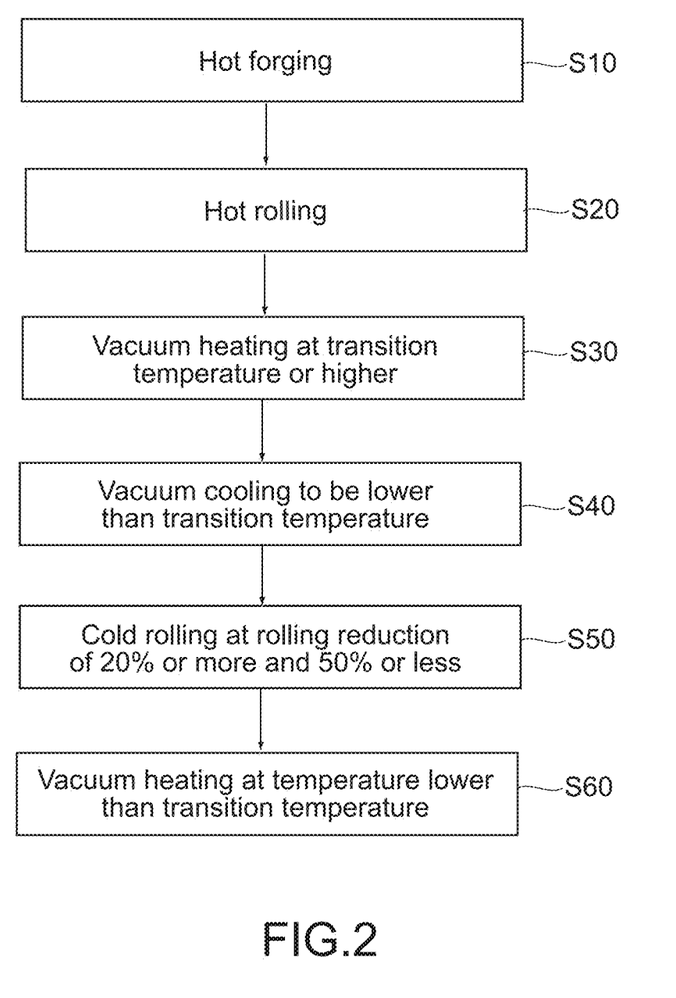
FIG. 2 is a flowchart showing a process of producing the target according to this embodiment.

FIG. 2 is a flowchart showing a process of producing the target according to this embodiment. FIG. 3(a) to FIG. 3(d) are each a schematic diagram showing a process of producing the target corresponding to FIG. 2.

Figure 3A:
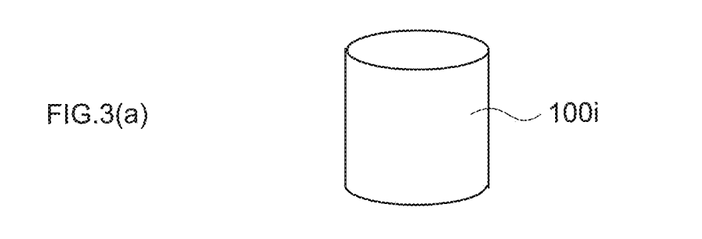
FIGS. 3(a)-3(d) are schematic diagrams showing a process of producing the target corresponding to FIG. 2.

In the process of producing the target according to this embodiment, for example, a cobalt material is melted by an electron beam in a crucible or the like, and after the melted cobalt material is cooled, a cobalt ingot 100i shown in FIG. 3(a) is formed.

Figure 3B:
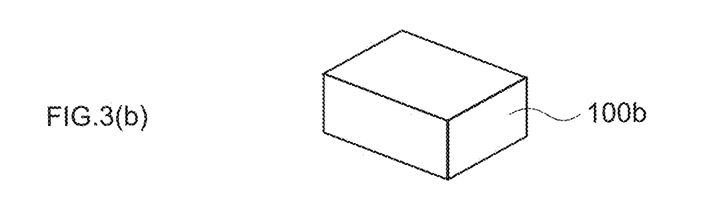

Next, hot forging is performed on the cobalt ingot 100i at 1000° C. or higher. As a result, a cobalt block 100b shown in FIG. 3(b) is formed.

Figure 3C:
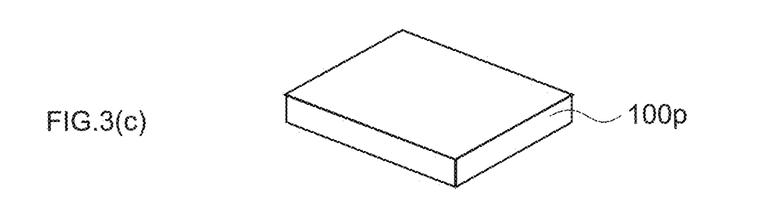

Next, hot rolling is performed on the cobalt block 100b at 1000° C. or higher. As a result, a cobalt plate 100p shown in FIG. 3(c) is formed.

Next, after the hot rolling, the cobalt plate 100p is cooled to room temperature or near room temperature, and then, vacuum heating (first vacuum heating) is performed on the cobalt plate 100p at a temperature higher than 449° C. This 449° C. is a phase transition temperature of cobalt. For example, in the case where the temperature of cobalt is changed from 449° C. to a temperature higher than 449° C., cobalt transitions from the hexagonal close-packed lattice structure to the face-centered cubic structure. The cobalt plate 100p is heated in vacuum at a temperature higher than this temperature (e.g., 600° C. or higher and 800° C. or lower).

If the cobalt plate 100p is rapidly cooled to a temperature lower than the transition temperature after performing hot rolling at 1000° C. or higher, the face-centered cubic structure remains in the cobalt plate 100p, not transitioning from the face-centered cubic structure to the hexagonal close-packed lattice structure due to supercooling. That is, in the rapidly cooled cobalt plate 100p, the hexagonal close-packed lattice structure and the face-centered cubic structure are mixed. Then, even if the processing proceeds to the subsequent steps in this state, the state where the hexagonal close-packed lattice structure and face-centered cubic structure are mixed will continue in the cobalt plate 100p.

Meanwhile, in this embodiment, after performing hot rolling at 1000° C. or higher, vacuum heating is performed on the cobalt plate 100p at a temperature higher than the transition temperature. As a result, all the crystal structures of the cobalt plate 100p are reset to the face-centered cubic structure once.

Note that another meanings of performing vacuum heating after hot rolling are for suppression of warpage of the cobalt plate 100p caused by hot rolling, suppression of variation in hardness in the cobalt plate 100p, and suppression of variation in the crystal grain size in the cobalt plate 100p.

Next, after performing the vacuum heating on the cobalt plate 100p, the cobalt plate 100p is cooled in vacuum. That is, since the cobalt plate 100p is cooled under the condition that there is no atmosphere such as an inert gas and air on the outer periphery of the cobalt plate 100p, the cobalt plate 100p is not rapidly cooled but is gradually cooled over a long time. Then, in the case where the temperature of the cobalt plate 100p reaches a temperature lower than the transition temperature, the face-centered cubic structure transitions to the hexagonal close-packed lattice structure. Then, the cobalt plate 100p having the hexagonal close-packed lattice structure is formed.

Figure 3D:
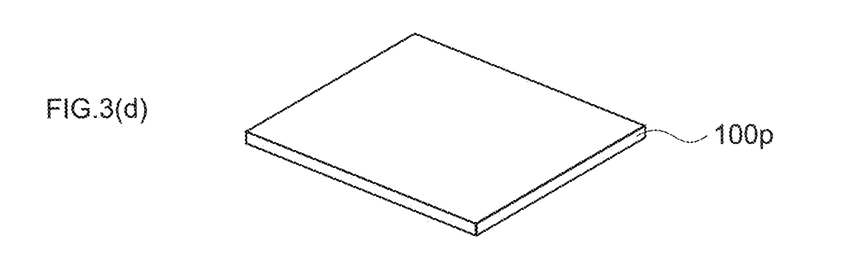

Next, after the cobalt plate 100p is cooled to room temperature or near room temperature, cold rolling is performed on the cobalt plate 100p as shown in FIG. 3(d). For example, in the case where the cobalt plate 100p is regarded as a rectangular parallelepiped, cold rolling is performed in opposing directions of two pairs of opposite sides of the rectangular parallelepiped. That is, cold rolling is performed in two axial directions perpendicular to each other.

The rolling reduction in this cold rolling is 17% or more and 35% or less, favorably 17% or more and 30% or less, and more favorably 17% or more and 25% or less. There is a possibility that the (002) plane and the (004) plane of the hexagonal close-packed lattice structure are oriented to be warped from the sputtering surface 10a in the case where the rolling reduction is less than 17%, and the cobalt plate 100p is cracked in the case where the rolling reduction is more than 35%, which is not favorable.

As described above, by performing cold rolling on the cobalt plate 100p at a high rolling reduction of 17% or more, the magnetization easy axes C of the hexagonal close-packed lattice structure randomly oriented in the cobalt plate 100p are aligned in the thickness direction (C axis direction) of the cobalt plate 100p over the entire area of the sputtering surface 10a. That is, the (002) plane and the (004) plane of the hexagonal close-packed lattice structure are oriented along the sputtering surface 10a over the entire area of the sputtering surface 10a.

At this time, if not cold rolling but warm rolling just below the transition temperature is performed, since pressure energy by rolling is applied to the cobalt plate 100p, the temperature of the cobalt plate 100p reaches the transition temperature or higher, and there is a possibility that the face-centered cubic structure is generated in the cobalt plate 100p. In this embodiment, since cold rolling is performed from the state where the temperature of the cobalt plate 100p has reached room temperature or near room temperature, the temperature of the cobalt plate 100p does not reach the transition temperature or higher even if pressure energy by rolling is applied to the cobalt plate 100p. That is, the cobalt plate 100p maintains the hexagonal close-packed lattice structure.

Next, vacuum heating (second vacuum heating) is performed again on the cobalt plate 100p at a temperature lower than the transition temperature (e.g., 400° C. or higher and lower than 449° C.). Since this vacuum heating is performed at a temperature lower than the transition temperature, the cobalt plate 100p maintains the hexagonal close-packed lattice structure. Further, by this vacuum heating, a small amount of face-centered cubic structure that has metastably existed in the cobalt plate 100p transitions to the hexagonal close-packed lattice structure. Further, by this vacuum heating, the stress applied to the cobalt plate 100p by cold rolling is relieved.

After that, the cobalt plate 100p is cut into a predetermined shape, and thus, the target 100 is formed.

Example

Figure 4:
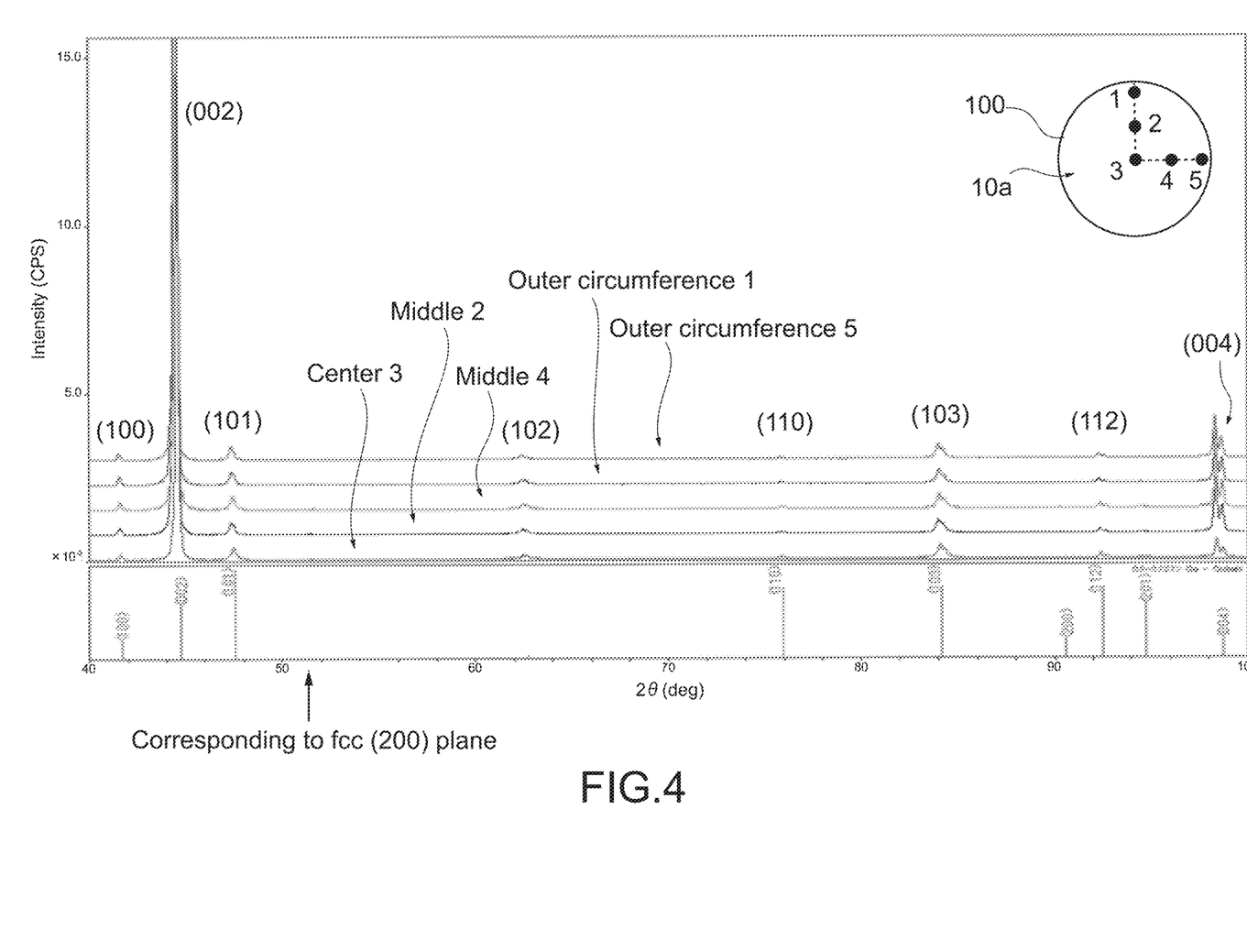
FIG. 4 is an X-ray diffraction measurement result of the target according to this embodiment.

FIG. 4 is an X-ray diffraction measurement result of the target according to this embodiment.

As the target 100, a disk-shaped one was used. Measurement points are a total of 5 points at the positions of an outer circumference 1, a middle 2, a center 3, a middle 4, and an outer circumference 5 in the sputtering surface 10a. The angle formed by the line connecting the outer circumference 1 and the center 3 and the line connecting the outer circumference 5 and the center 3 is 90°. Further, the thickness of the target 100 is 3 mm and the outer diameter is 400 mm.

The X-ray diffraction measurement conditions are as follows.

Scanning method: 2θ/θ method
Target: Cu
Tube voltage: 40 kV
Tube current: 100 mA
Scan speed: 5°/min
Sampling width: 0.02°
Divergent slit: 1°
Scattering slit: 1°
Light receiving slit: 0.3 mm As shown in FIG. 4, in any place of the target 100, for example, no peak (near 51°) of the fcc (200) plane attributed to the face-centered cubic structure was observed, and a sharp peak attributed to the hexagonal close-packed lattice structure was observed.

Figure 5:
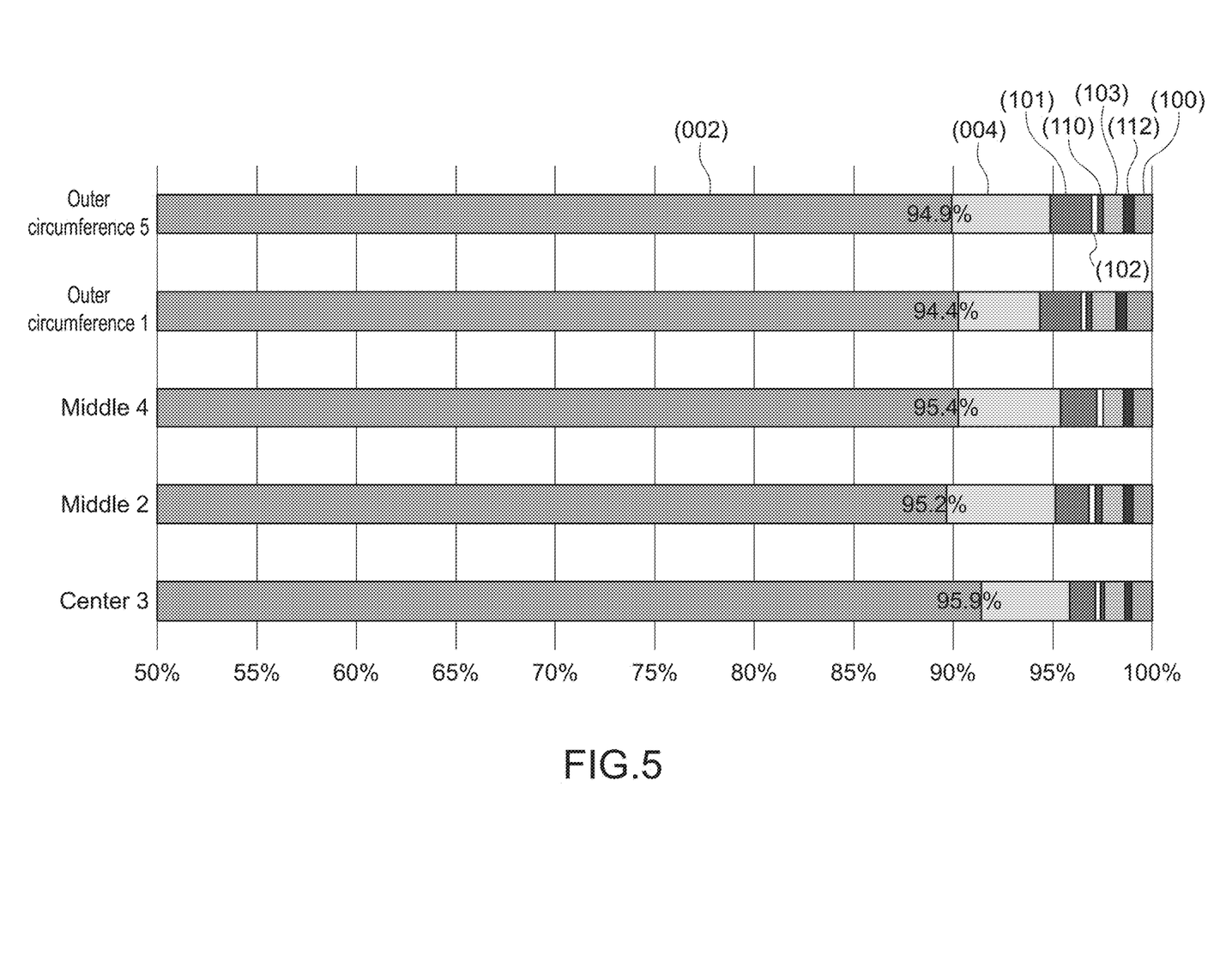
FIG. 5 is a graph showing a ratio of the XRD peak intensity.

FIG. 5 is a graph showing a ratio of the XRD peak intensity. Here, display of 50% or less is omitted.

FIG. 5 shows the ratio (%) of an intensity $I_{(002)}+I_{(004)}$ that is the sum of the X-ray diffraction peaks corresponding to the (002) plane and (004) plane to the sum $(I_{(100)}+I_{(002)}+I_{(101)}+I_{(102)}+I_{(110)}+I_{(103)}+I_{(112)}+I_{(004)})$ of intensities of the X-ray diffraction peaks corresponding to the (100) plane, (002) plane, (101) plane, (102) plane, (110) plane, (103) plane, (112) plane, and (004) plane of the hexagonal close-packed lattice structure at each measurement point.

TABLE 1

|  | $I_{(002)} + I_{(004)}$ Ratio (%) | Full width at half maximum of (002) peak (°) | Maximum relative permeability $\mu_{max}$ |
| --- | --- | --- | --- |
| Outer circumference 5 | 94.9 | 0.172 | 4.3 |
| Outer circumference 1 | 94.4 | 0.193 | 4.2 |
| Middle 4 | 95.4 | 0.172 | 4.5 |
| Middle 2 | 95.2 | 0.174 | 4.6 |
| Center 3 | 95.9 | 0.189 | 4.6 |
| Average value | 95.1 | 0.180 | 4.4 |
| σ | 0.008 | 0.06 | 0.045 |

As shown in Table 1, the average value of the ratio (%) of $I_{(002)}+I_{(004)}$ shown in FIG. 5 was 95.1%. That is, it can be seen that the intensity ratio $(I_{(002)}+I_{(004)})/(I_{(100)}+I_{(002)}+I_{(101)}+I_{(102)}+I_{(110)}+I_{(103)}+I_{(112)}+I_{(004)})$ of the X-ray diffraction peaks in the target 100 is 0.85 or more as an average value of measurement at 5 points on the sputtering surface 10a.

Further, variation σ in $I_{(002)}+I_{(004)}$ derived from a formula A of $(I_{max}-I_{min})/(I_{max}+I_{min})$ when the maximum value of $I_{(002)}+I_{(004)}$ was $I_{max}$ and the minimum value was $I_{min}$ was 0.008%, exhibiting excellent in-plane distribution characteristics.

Further, the half value width of the peak attributed to the (002) plane of the hexagonal close-packed lattice structure is favorably 0.3° or less, and was 0.18° or less as an average value of actual measurement at 5 points. The variation σ in the half value width of the peak derived from the formula A was 0.06°.

In particular, if the second vacuum heating is omitted, the face-centered cubic structure remains in the cobalt target and a peak attributed to the fcc (200) is observed in the cobalt target in some cases. In the case where the second vacuum heating is omitted, the average value of the half value width of the peak attributed to the fcc (200) of the cobalt target is 0.61°, and the average value of the half value width of the peak attributed to the (002) plane of the hexagonal close-packed lattice structure is 0.50°. Therefore, a ratio R of the half value width of the peak attributed to the hcp(002) to the half value width of the peak attributed to the fcc (200) of the cobalt target in the case where the second vacuum heating is omitted is 0.82.

Since the second vacuum heating is performed on the target 100 according to this embodiment, even if a very small amount of face-centered cubic structure remains, the intensity of the peak attributed to the fcc (200) is weaker and the half value width of the peak attributed to the fcc (200) is wider as compared with the case where the second vacuum heating is not performed. Further, as compared with the case where the second vacuum heating is not performed, the intensity of the peak attributed to the hcp (002) is stronger and the half value width of the peak attributed to the hcp (002) is narrower. Therefore, in this embodiment, it can be estimated that the ratio R is 0.82 or more.

Further, Table 1 also shows the maximum relative magnetic permeability ($\mu_{max}$) in the target in addition to the intensity ratio of the X-ray diffraction peak and the half value width of the peak attributed to (002). Here, the maximum relative magnetic permeability $\mu_{max}$ is the maximum value of the relative magnetic permeability along the sputtering surface 10a in the applied magnetic field range.

Further, as shown in Table 1, the maximum relative magnetic permeability of the target 100 is within the range of 4.2 or more and 4.6 or less in the sputtering surface 10a. Further, the variation σ of the maximum relative magnetic permeability derived from the formula A was 0.045. As described above, the relative magnetic permeability along the sputtering surface 10a was less than 5, exhibiting an excellent relative magnetic permeability.

Although an embodiment of the present invention has been described above, it goes without saying that the present invention is not limited to only the above-mentioned embodiment and various modifications can be made.

REFERENCE SIGNS LIST 10a sputtering surface
10b back surface
100, 101 target
100i cobalt ingot
100b cobalt block
100p cobalt plate

The invention claimed is:

1. A sputtering target, that is a cobalt target having a sputtering surface and a purity of 99.95 wt % or more, an intensity ratio $(I_{(002)}+I_{(004)})/(I_{(100)}+I_{(002)}+I_{(101)}+I_{(102)}+I_{(110)}+I_{(103)}+I_{(112)}+I_{(004)})$ of X-ray diffraction peaks corresponding to a (100) plane, a (002) plane, a (101) plane, a (102) plane, a (110) plane, a (103) plane, a (112) plane, and a (004) plane of a hexagonal close-packed lattice structure along the sputtering surface being 0.85 or more.

2. The sputtering target according to claim 1, wherein
a relative magnetic permeability along the sputtering surface is less than 5.

3. The sputtering target according to claim 1, wherein
a half value width of the X-ray diffraction peak of the (002) plane of the hexagonal close-packed lattice structure along the sputtering surface is 0.3° or less.

4. A method of producing a sputtering target, comprising:
forming a cobalt plate by performing hot forging and hot rolling on a cobalt ingot;
performing first vacuum heating on the cobalt plate at a temperature higher than a transition temperature, a transition from a hexagonal close-packed lattice structure to a face-centered cubic structure taking place at the transition temperature;
performing vacuum cooling on the cobalt plate so that a temperature of the cobalt plate is lower than the transition temperature;
performing cold rolling on the cobalt plate so that a rolling reduction is 17% or more and 35% or less; and
performing second vacuum heating on the cobalt plate at a temperature lower than the transition temperature.

* * * * *